United States Patent
Liu et al.

(10) Patent No.: US 10,026,830 B2
(45) Date of Patent: Jul. 17, 2018

(54) TUNNELING FIELD EFFECT TRANSISTOR (TFET) HAVING A SEMICONDUCTOR FIN STRUCTURE

(71) Applicant: STMicroelectronics, Inc., Coppell, TX (US)

(72) Inventors: Qing Liu, Watervliet, NY (US); Salih Muhsin Celik, Niskayuna, NY (US)

(73) Assignee: STMicroelectronics, Inc., Coppell, TX (US)

( * ) Notice: Subject to any disclaimer, the term of this patent is extended or adjusted under 35 U.S.C. 154(b) by 85 days.

(21) Appl. No.: 14/698,921

(22) Filed: Apr. 29, 2015

(65) Prior Publication Data
US 2016/0322479 A1    Nov. 3, 2016

(51) Int. Cl.
| | |
|---|---|
| *H01L 27/12* | (2006.01) |
| *H01L 29/66* | (2006.01) |
| *H01L 29/165* | (2006.01) |
| *H01L 29/78* | (2006.01) |
| *H01L 29/51* | (2006.01) |
| *H01L 29/06* | (2006.01) |
| *H01L 29/739* | (2006.01) |

(52) U.S. Cl.
CPC .... *H01L 29/66977* (2013.01); *H01L 29/0649* (2013.01); *H01L 29/165* (2013.01); *H01L 29/516* (2013.01); *H01L 29/66356* (2013.01); *H01L 29/7391* (2013.01); *H01L 29/7851* (2013.01)

(58) Field of Classification Search
CPC .......... H01L 27/11543; H01L 29/0895; H01L 29/66151; H01L 29/66219; H01L 29/66931; H01L 29/7311; H01L 29/7376; H01L 29/7883; H01L 29/88; H01L 29/882; H01L 33/04; H01L 33/06; H01L 39/221
See application file for complete search history.

(56) References Cited

U.S. PATENT DOCUMENTS

| | | | | |
|---|---|---|---|---|
| 5,780,900 A | * | 7/1998 | Suzuki | H01L 29/0873 257/335 |
| 6,127,703 A | * | 10/2000 | Letavic | H01L 29/78624 257/344 |
| 8,368,127 B2 | | 2/2013 | Zhu et al. | |
| 8,384,122 B1 | * | 2/2013 | Hu | H01L 29/7391 257/104 |
| 8,633,516 B1 | * | 1/2014 | Wu | H01L 29/66795 257/192 |
| 8,890,120 B2 | | 11/2014 | Kotlyar et al. | |

(Continued)

*Primary Examiner* — Cuong B Nguyen
*Assistant Examiner* — Samuel Park
(74) *Attorney, Agent, or Firm* — Crowe & Dunlevy

(57) ABSTRACT

A tunneling field effect transistor is formed from a fin of semiconductor material on a support substrate. The fin of semiconductor material includes a source region, a drain region and a channel region between the source region and drain region. A gate electrode straddles over the fin at the channel region. Sidewall spacers are provided on each side of the gate electrode. The source of the transistor is made from an epitaxial germanium content source region grown from the source region of the fin and doped with a first conductivity type. The drain of the transistor is made from an epitaxial silicon content drain region grown from the drain region of the fin and doped with a second conductivity type.

29 Claims, 18 Drawing Sheets

(56) References Cited

U.S. PATENT DOCUMENTS

| | | | |
|---|---|---|---|
| 2004/0155284 A1* | 8/2004 | Kim | H01L 21/28282 257/324 |
| 2006/0220102 A1* | 10/2006 | Mathew | H01L 21/28273 257/316 |
| 2006/0258072 A1* | 11/2006 | Kavalieros | H01L 29/7391 438/197 |
| 2007/0080409 A1* | 4/2007 | Seliskar | H01L 21/823487 257/401 |
| 2008/0179650 A1* | 7/2008 | Kawakita | H01L 21/823425 257/296 |
| 2008/0290408 A1* | 11/2008 | Hsu | H01L 29/0657 257/335 |
| 2009/0026553 A1* | 1/2009 | Bhuwalka | H01L 29/66356 257/402 |
| 2009/0130805 A1* | 5/2009 | Babcock | H01L 21/26506 438/151 |
| 2010/0025766 A1* | 2/2010 | Nuttinck | H01L 29/7391 257/351 |
| 2010/0200916 A1* | 8/2010 | Gossner | H01L 29/083 257/335 |
| 2011/0049474 A1 | 3/2011 | Bjoerk et al. | |
| 2011/0084319 A1* | 4/2011 | Zhu | B82Y 10/00 257/288 |
| 2011/0108918 A1* | 5/2011 | Yin | H01L 21/26586 257/347 |
| 2011/0147838 A1* | 6/2011 | Gossner | H01L 29/7391 257/345 |
| 2011/0210375 A1* | 9/2011 | Ikeda | B82Y 10/00 257/192 |
| 2011/0303950 A1* | 12/2011 | Lauer | H01L 29/7391 257/192 |
| 2013/0221407 A1* | 8/2013 | Hou | H01L 29/785 257/192 |
| 2013/0320427 A1 | 12/2013 | Loh et al. | |
| 2014/0048765 A1* | 2/2014 | Ma | H01L 29/78 257/12 |
| 2014/0170827 A1 | 6/2014 | Zhang | |
| 2014/0209863 A1* | 7/2014 | Kondo | H01L 29/66356 257/29 |
| 2014/0210025 A1* | 7/2014 | Guo | A63F 13/10 257/421 |
| 2015/0287802 A1* | 10/2015 | Lee | H01L 29/1054 257/105 |
| 2016/0079415 A1* | 3/2016 | Sugizaki | H01L 29/7391 257/335 |
| 2016/0197184 A1* | 7/2016 | Xu | H01L 29/0688 257/12 |
| 2016/0233333 A1* | 8/2016 | Toh | H01L 29/7833 |
| 2016/0240666 A1* | 8/2016 | Miyata | H01L 29/42368 |

\* cited by examiner

US 10,026,830 B2

TUNNELING FIELD EFFECT TRANSISTOR (TFET) HAVING A SEMICONDUCTOR FIN STRUCTURE

TECHNICAL FIELD

The present invention relates to integrated circuits and, in particular, to a semiconductor transistor device of the tunneling field effect transistor (TFET) type.

BACKGROUND

Reference is now made to FIG. 1 showing the configuration of a conventional tunneling field effect transistor (TFET) 10 device. A semiconductor substrate 12 is lightly doped with a first conductivity type (in this example, n-type) dopant. The semiconductor substrate may, for example, be made of a silicon material, and can be either a bulk substrate or a silicon-on-insulator (SOI) substrate. A source region 14 and a drain region 16 are provided in the substrate 12 on each side of a channel region 18, wherein the channel region is made of the lightly doped first conductivity type semiconductor material. Unlike a convention MOSFET device, where both the source and drain are doped with the same conductivity type dopant opposite from that used for the channel (for example, p-type), the TFET is constructed such that the source region 14 is heavily doped with the second conductivity type (in this example, p-type) dopant and the drain region 16 is heavily doped with the first conductivity type dopant. A gate oxide layer 20 is provided over the channel region 18, and a gate electrode 22 is provided over the gate oxide layer 20.

FIG. 2A shows a graph illustrating operation of the TFET device in the OFF state where the applied gate voltage produces band bending that is insufficient to allow tunneling. In this state, the leakage current of the transistor is very low because any such leakage is due only to the drift of minority carriers. FIG. 2B shows a graph illustrating operation of the TFET device in the ON state where the applied gate voltage induces sufficient band bending to produce a reduction of the tunneling barrier width. This leads to band-to-band tunneling (BTBT) of electrons (reference 24) from the valence band of the source region 14 to the conduction band of the drain region 16.

Those skilled in the art further recognize that the provision of germanium (Ge), or to a lesser degree silicon-germanium (SiGe), as the semiconductor material used in the p++ doped source region 14 can improve the tunneling current and the ratio of on-current (Ion) to off-current (Ioff). This is shown in FIGS. 2A-2B by the solid lines for the conduction and valence bands for germanium as compared to the dash-dot lines which show operation using a p++ doped silicon (Si) source region. The increase in the valence band gap (Ev) resulting from the use of a germanium source region 14 further decreases/narrows the tunneling barrier width.

Notwithstanding the foregoing improvement in performance, there continues to be a need in the art to provide a TFET device exhibiting improved drive current capabilities.

SUMMARY

In an embodiment, a tunneling field effect transistor comprises: a support substrate; a fin of semiconductor material including a source region, a drain region and a channel region between the source region and drain region; a gate electrode straddling over the fin at said channel region; sidewall spacers on each side of the gate electrode; an epitaxial germanium content source region grown from the source region of said fin and doped with a first conductivity type; and an epitaxial silicon content drain region grown from the drain region of said fin and doped with a second conductivity type.

In an embodiment, a method comprises: defining a fin of semiconductor material on a support substrate, said fin of semiconductor material including a source region, a drain region and a channel region between the source region and drain region; forming a gate stack straddling over the fin at said channel region; forming sidewall spacers on each side of the gate stack; epitaxially growing a germanium content source region from the source region of said fin, said germanium content source region doped with a first conductivity type; and epitaxially growing a silicon content drain region from the drain region of said fin, said silicon content drain region doped with a second conductivity type.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 3-17 which illustrate the process steps in the formation of a tunneling field effect transistor (TFET) device. It will be understood that the drawings do not necessarily show features drawn to scale.

Figure 1:
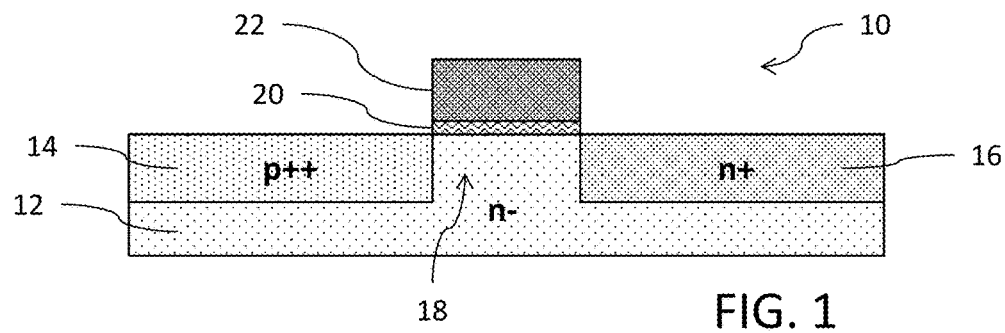
FIG. 1 illustrates the configuration of a prior art tunneling field effect transistor (TFET) device.
Figure 2A:
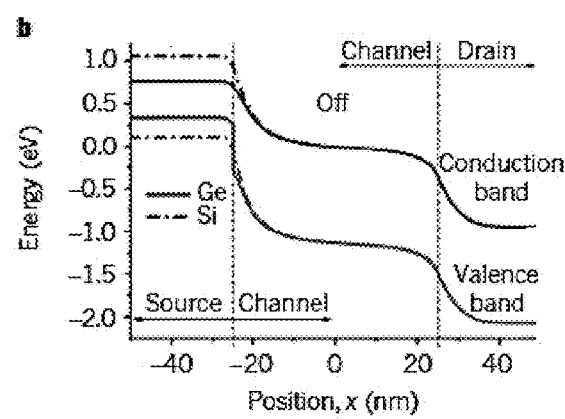
FIGS. 2A-2B illustrate operation of the TFET device of FIG. 1.
Figure 2B:
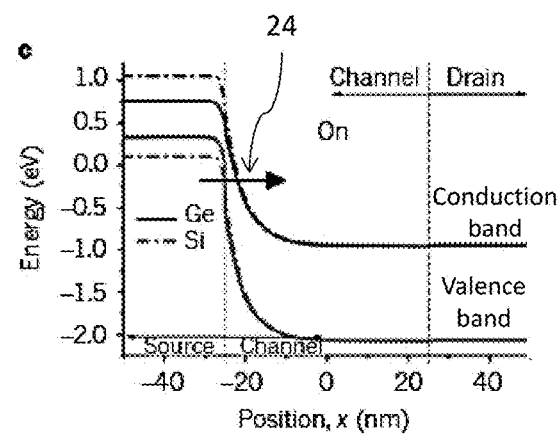
Figure 3:
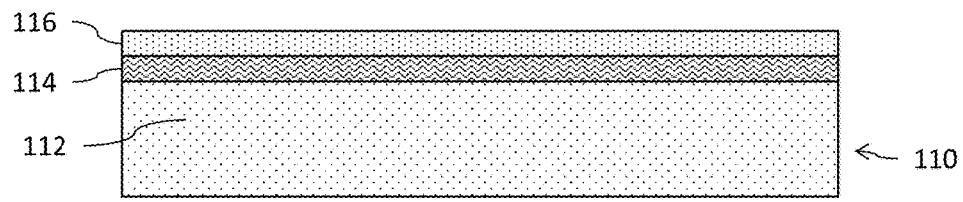
FIGS. 3-17 illustrate process steps in the formation of a TFET device.

FIG. 3 shows a silicon on insulator (SOI) semiconductor substrate 110 comprising a semiconductor substrate 112, an insulating layer 114 and a silicon semiconductor layer 116 in a stack. The silicon semiconductor layer 116 may be doped in accordance with the application, or alternatively may be un-doped in which case the SOI substrate 110 is of the "fully-depleted" type. The semiconductor layer 116 may, for example, have a thickness of 4-16 nm. The insulating layer 114 is commonly referred to in the art as a buried oxide (BOX) layer.

Figure 4:
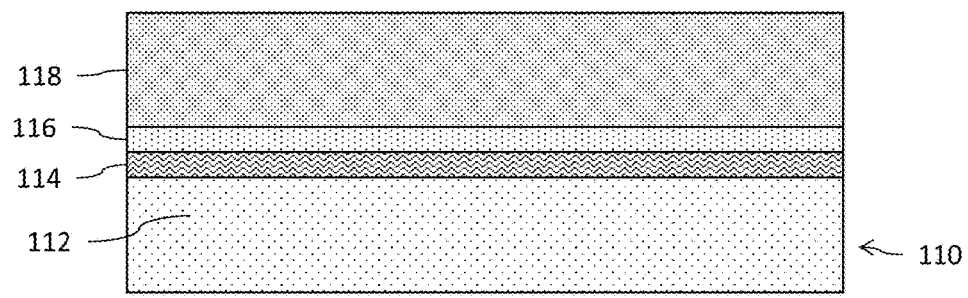

An epitaxial growth process as known in the art is then used to grow a semiconductor layer 118 made of silicon-germanium (SiGe) or germanium (Ge) on top of the semiconductor layer 116. The layer 118 may, for example have a thickness of 20-40 nm. The epitaxial growth process is based on $SiH_4$ or DTS as known to those skilled in the art. The result is shown in FIG. 4.

Figure 5:
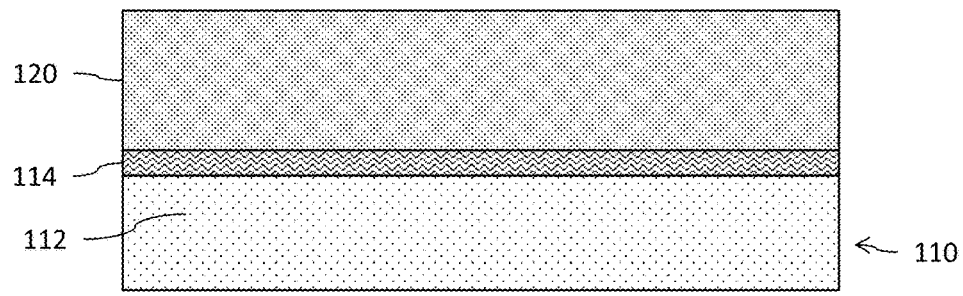

A condensation technique is then performed to drive the germanium atoms from the layer 118 into the layer 116. The condensation process may, for example, comprise an oxidation process in which a layer of $SiO_2$ is deposited and then the wafer is placed in a furnace with oxygen resulting in oxidization of the SiGe top region and driving of germanium in the silicon layer 116. The result of this operation is shown in FIG. 5 to produce a semiconductor layer 120 on top of the insulating layer 114 having high germanium content in excess of 80% and a thickness of, for example, 20-40 nm.

Figure 6:
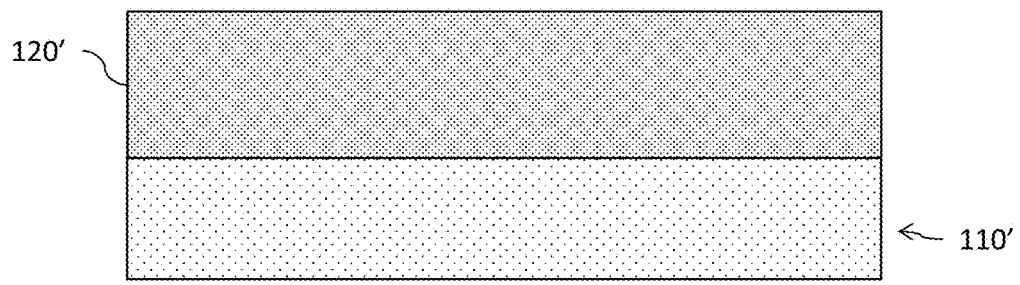

As an alternative, a bulk silicon semiconductor wafer 110' could be used as the starting point for the process. An epitaxial growth process as known in the art is then used to grow a semiconductor layer 120' made of silicon-germanium (SiGe) or germanium (Ge) on top of the bulk wafer 110'. The layer 120' may, for example have a thickness of 20-40 nm. The epitaxial growth process is based on $SiH_4$ or DTS as known to those skilled in the art. The result is shown in FIG. 6, with the layer 120' preferably having high germanium content in excess of 80%.

Figure 7:
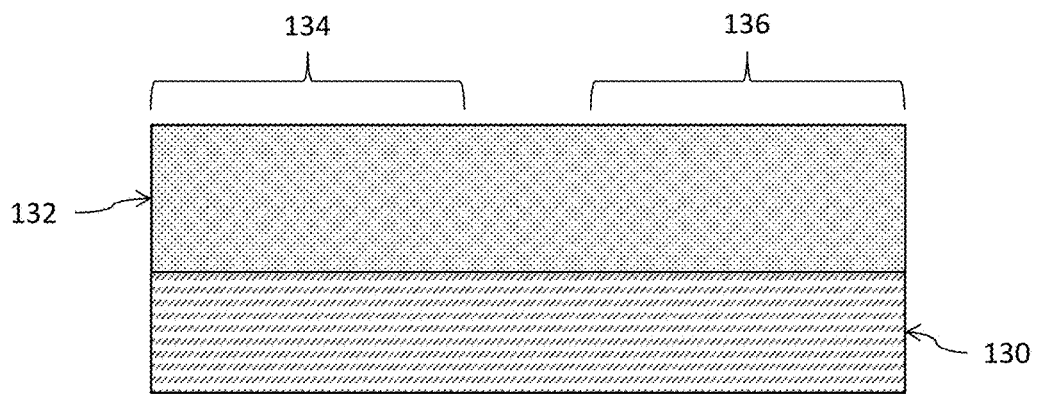

Reference is now made to FIG. 7. In this figure, the reference 130 generically refers to a support substrate which may, for example, comprise the semiconductor substrate 112 and insulating layer 114 from the SOI substrate 110 (see, FIGS. 3-5). Alternatively, the support substrate of reference 130 may instead comprise the bulk silicon semiconductor wafer 110' (see, FIG. 6). Furthermore, the reference 132 generically refers to one of the high germanium content semiconductor layers 120 or 120'. So, it will be understood that the remaining process steps described below in the fabrication of the TFET device may use either substrate as a starting point.

Using conventional lithographic patterning techniques known to those skilled in the art, a mask is formed to expose a region 134. A dopant implantation of a first conductivity type (for example, p-type) dopant is made through the mask in the germanium content semiconductor layer 132 within region 134. The p-type dopant may, for example, comprise boron, boron difluoride ($BF_2$) or indium that is implanted with a dopant concentration of $1 \times 10^{20}$ to $5 \times 10^{20}$ at/cm$^3$.

Using conventional lithographic patterning techniques known to those skilled in the art, a mask is formed to expose the region 136. A dopant implantation of a second conductivity type (for example, n-type) is then made through the mask in the germanium content semiconductor layer 132 within region 136. The n-type dopant may, for example, comprise arsenic or phosphorus that is implanted with a dopant concentration of $5 \times 10^{19}$ to $1 \times 10^{20}$ at/cm$^3$.

Figure 8:
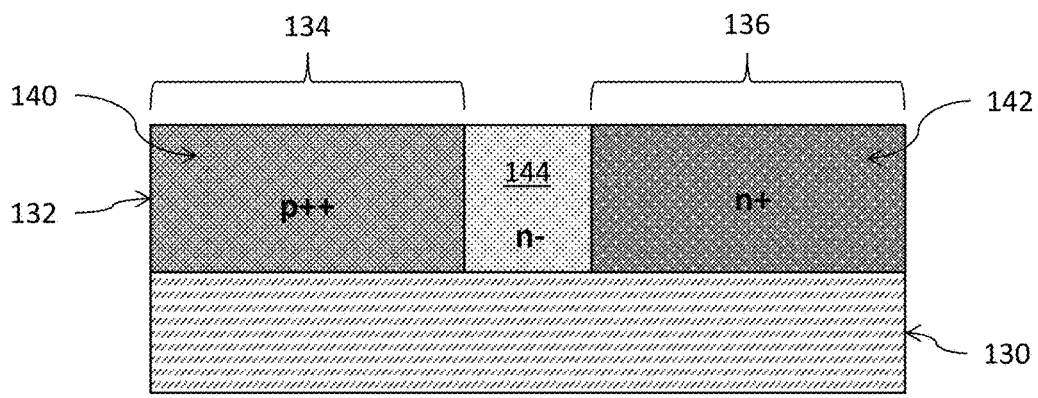

A low temperature anneal is then performed to activate the implanted dopants in the regions 134 and 136 and re-crystallize the high germanium content semiconductor layer 132 so as to provide a p-type doped region 140 and an n-type doped region 142. The anneal may, for example, use a temperature of <650° C. for a time of 30-60 seconds and/or use a <700° C. spike for a time of 1-100 milliseconds. The regions 140 and 142 are separated by a portion 144 of the high germanium content semiconductor layer 132 that is doped with the second conductivity type (n-type) dopant. The result is shown in FIG. 8.

Figure 9:
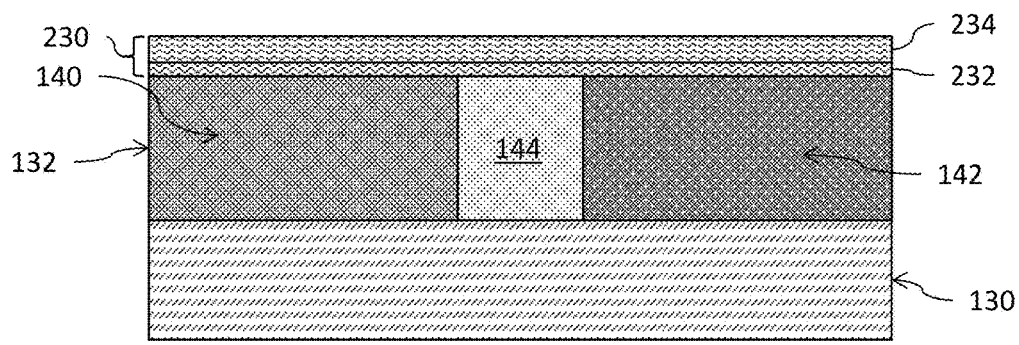
Figure 10A:
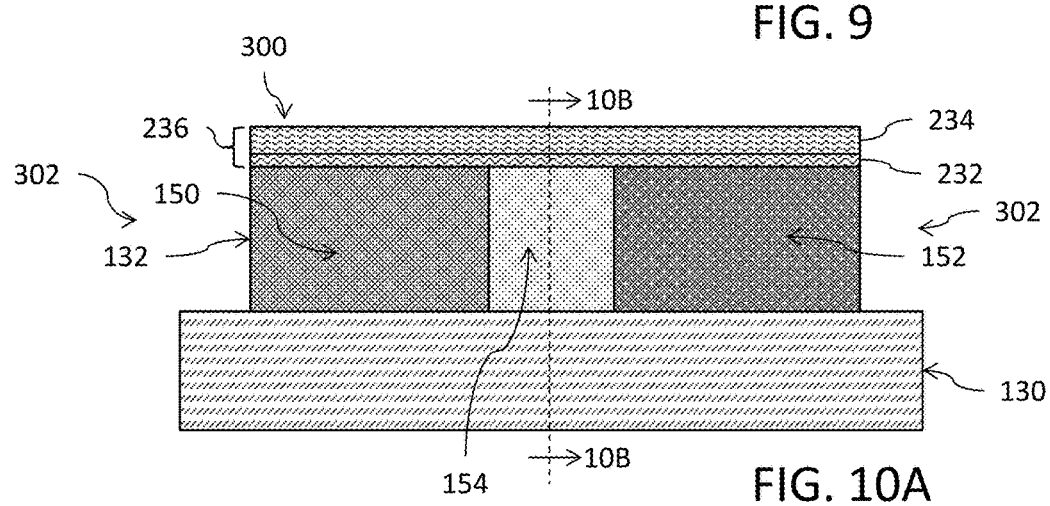
Figure 10B:
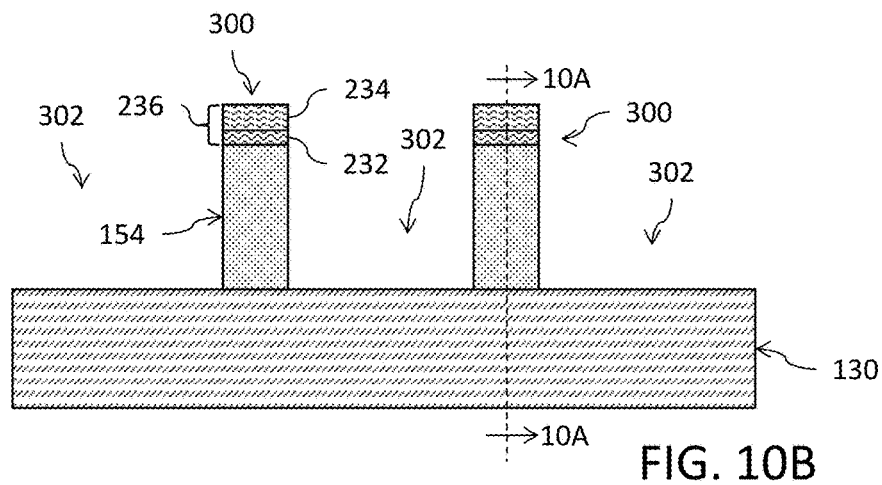

A hard mask 230 comprising a layer of silicon dioxide ($SiO_2$) 232 and a layer of silicon nitride (SiN) 234 is then deposited on the high germanium content semiconductor layer 132 (and regions 140, 142 and 144). The silicon dioxide layer 232 may, for example, be deposited using a chemical vapor deposition (CVD) process with a thickness of, for example, approximately 3-10 nm. The silicon nitride layer 234 may, for example, be deposited using a chemical vapor deposition (CVD) process with a thickness of, for example, approximately 20-40 nm. The result is shown in FIG. 9.

A lithographic process as known in the art is then used to define a plurality of fins 300 from the germanium content semiconductor layer 132. The hard mask 230 is patterned to leave mask material 236 at the desired locations of the fins 300. An etching operation is then performed through the mask to open apertures 302 on each side of each fin 300. In a preferred embodiment with the SOI substrate, for example, the etch defining the fins 300 extends to a depth which reaches the insulating layer 114. The fins 300 may have a width of 6-12 nm and a pitch of 24-50 nm (with a spacing between adjacent fins of 10-40 nm). The result of the etching process for fin formation is shown in orthogonal cross-section FIGS. 10A and 10B. Each fin 300 includes a source region 150 formed from the p-type doped region 140, a drain region 152 formed from the n-type doped region 142 and a channel region 154 formed from the region 144. The mask material 236 is then removed.

Figure 11:
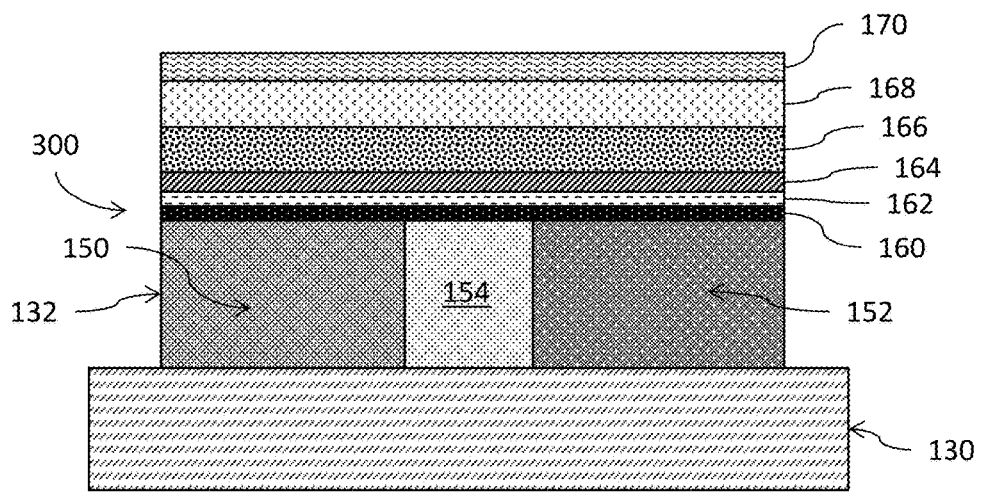

The process next moves to the deposition of the gate stack materials for the TFET device. The gate stack materials comprise a high-k dielectric layer 160, an optional barrier layer 162, a metal layer 164, a ferroelectric material layer 166, a polysilicon layer 168 and a hard mask layer 170. The result is shown in FIG. 11. The high-k dielectric layer 160 may, for example, comprise hafnium oxide ($HfO_2$) deposited using an atomic layer deposition technique to a thickness of 1-3 nm for use as the gate oxide. The optional barrier layer 162 may, for example, comprise lanthanum oxide ($La_2O_3$) deposited using an atomic layer deposition technique to a thickness of 1-3 nm. The metal layer 164 may, for example, comprise titanium nitride (TiN) deposited using a chemical vapor deposition technique to a thickness of 3-8 nm for use as the work function metal of the gate electrode. The ferroelectric material layer 166 may, for example, comprise lead zirconium titanate ($PbZrTiO_3$), a piezoelectric material known as "PZT", deposited using a chemical vapor deposition technique to a thickness of 10-20 nm for use to induce a negative capacitive effect for the gate electrode. The polysilicon layer 168 is, for example, deposited using a chemical vapor deposition technique to a thickness of 20-60 nm and may be doped as necessary for the application. The hard mask layer 170 may, for example, comprise silicon nitride (SiN) deposited using a chemical vapor deposition technique to a thickness of 20-40 nm.

Figure 12A:
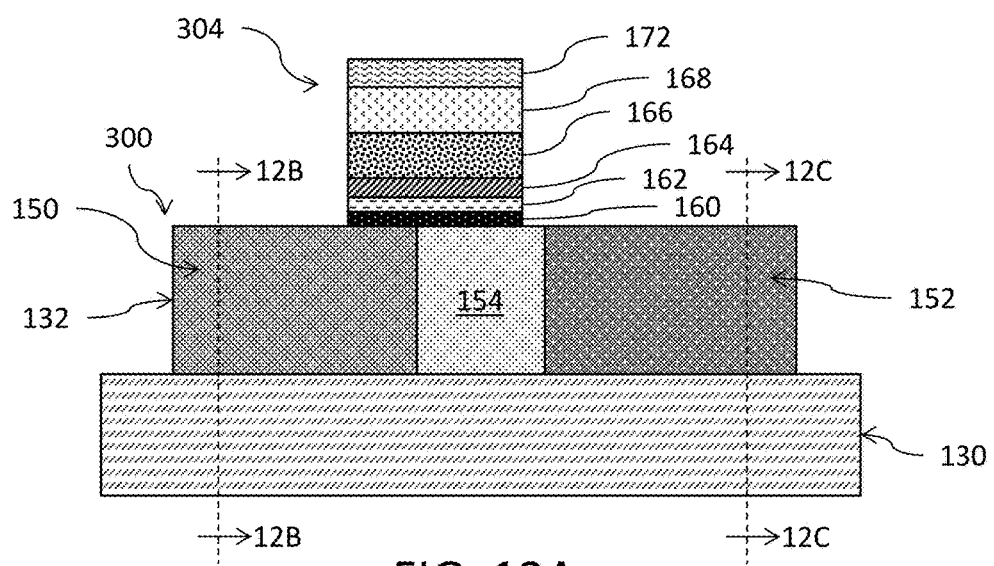
Figure 12B:
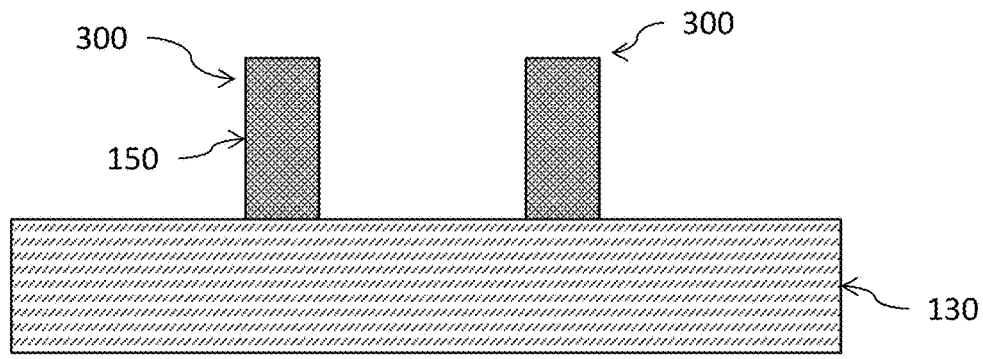
Figure 12C:
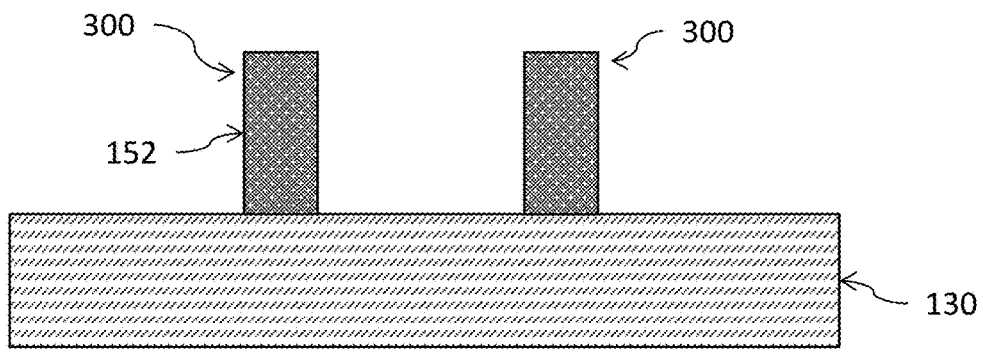
Figure 12D:
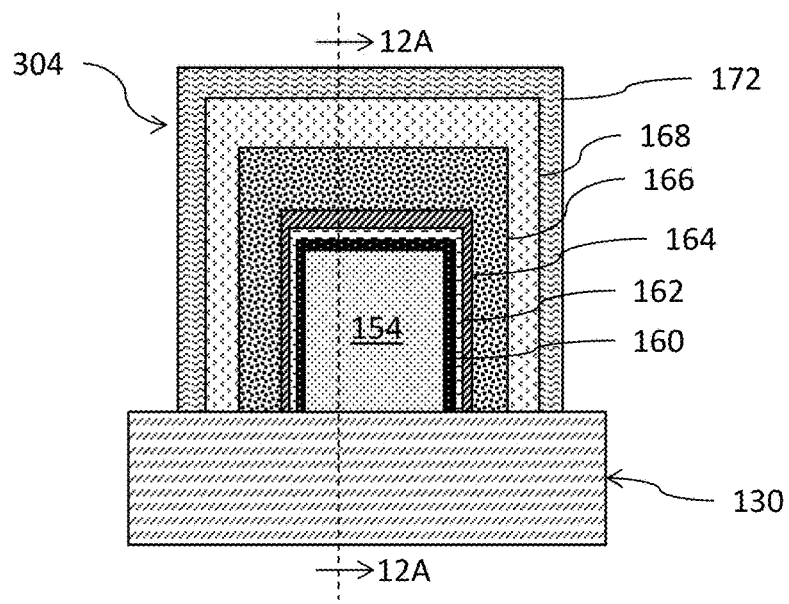

A lithographic process as known in the art is then used to define the gate stack 304 from the gate stack materials. The hard mask 170 is patterned to leave mask material 172 at the desired location of the gate stack 304. An etching operation is then performed through the mask to form the gate stack 304 from the layers 160-170. The gate stack 304 may have a width of 20-50 nmnm. The result of the etching process for gate stack formation is shown in FIG. 12A. FIGS. 12B and 12C show cross-sections through the source and drain regions, respectively, of the fins 300. Although not explicitly shown in FIGS. 12B and 12C, it will be understood that the gate stack 304 extends perpendicular to and straddles over the fins 300 with a configuration as is known in the art with respect to finFET transistors and as is generally shown in FIG. 12D. It will be noted in FIG. 12A that the gate stack is offset from the channel region in a configuration where the gate stack also partially overlies the source region so that the gate can control the tunneling region located at the interface between the p++ doped source region and the n-channel region.

Figure 13:
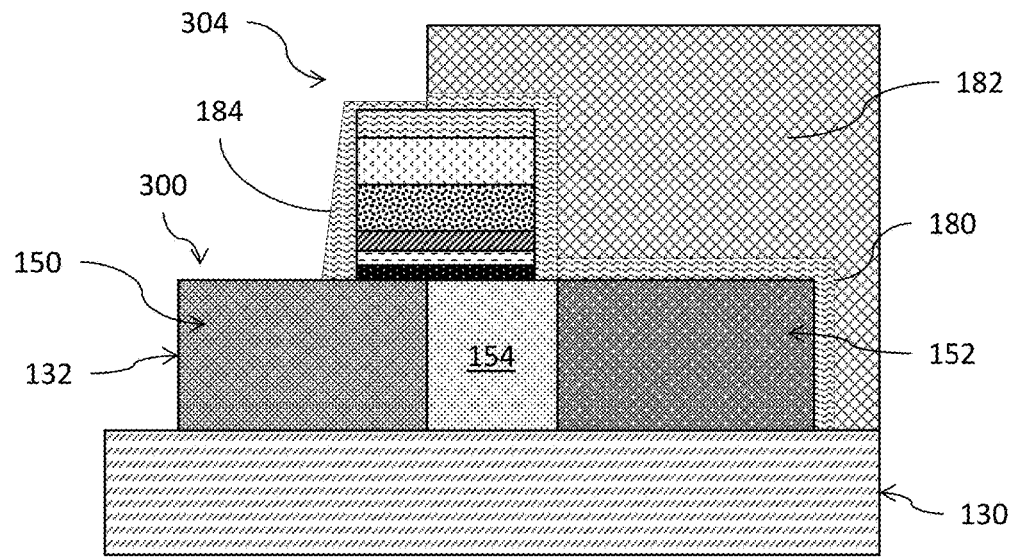

A conformal deposit of a layer 180 of silicon nitride (SiN) is then made using an atomic layer deposition technique. The layer 180 may have a thickness of 6-12 nm. A blocking mask 182 is then formed to protect the drain side of the fins 300. A directional etch, such as a reactive ion etch (RIE) is then performed to define a sidewall spacer 184 on the source side of the gate stack 304. The result is shown in FIG. 13.

Figure 14A:
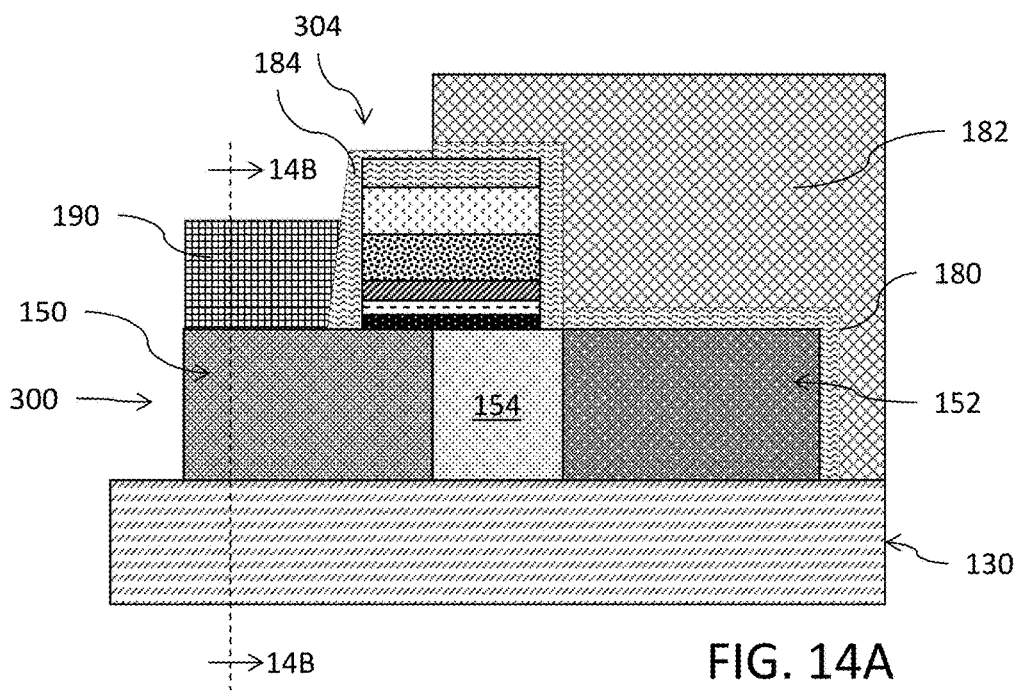
Figure 14B:
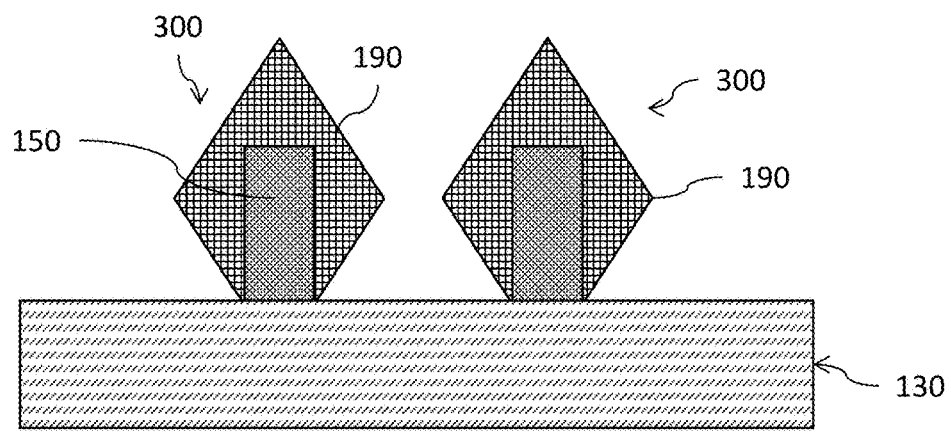

An epitaxial growth process as known in the art is then used to grow a silicon-germanium source region 190 from the exposed surfaces of the source region 150 of the fins 300. The silicon-germanium source region 190 may, for example, be in situ doped with the first conductivity type (p-type) using a boron dopant with a dopant concentration of $1\times10^{20}$ to $5\times10^{20}$ at/cm$^3$. The result is shown in FIGS. 14A and 14B. The presence of source region 190 along with source region 150 is preferred because the region 190 can provide a higher active dopant concentration which is beneficial to reducing contact resistance and may further improve the junction sharpness for better tunneling.

Figure 15:
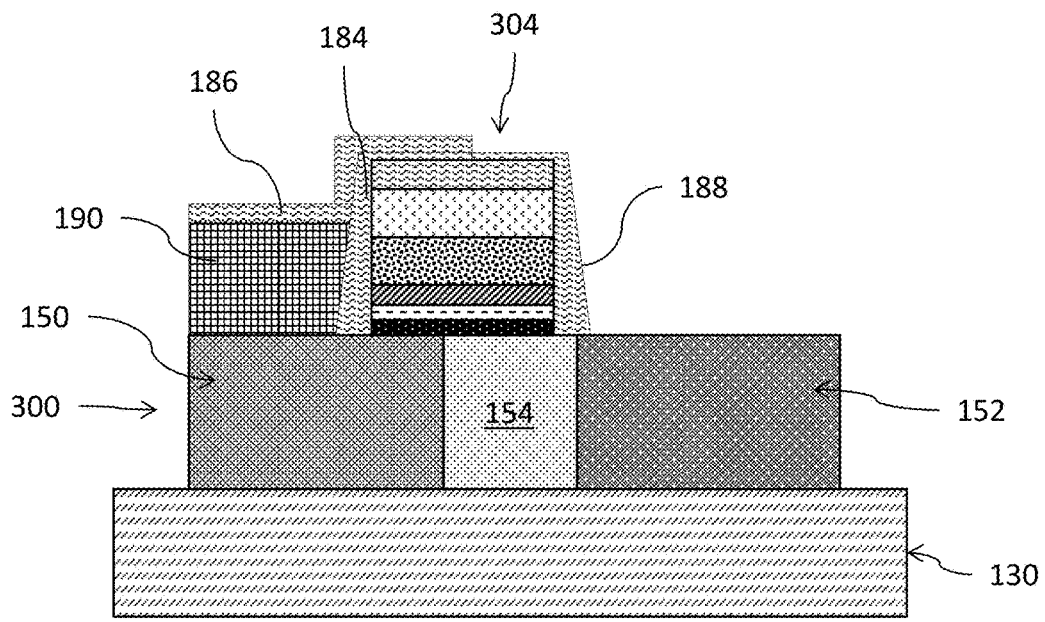

A conformal deposit of a layer 186 of silicon nitride (SiN) is then made using an atomic layer deposition technique to protect the silicon-germanium region 190. The layer 182 may have a thickness of 3-6 nm. The blocking mask 182 is removed. A directional etch, such as a reactive ion etch (RIE) is then performed to define a sidewall spacer 188 on the drain side of the gate stack 304. The result is shown in FIG. 15.

Figure 16A:
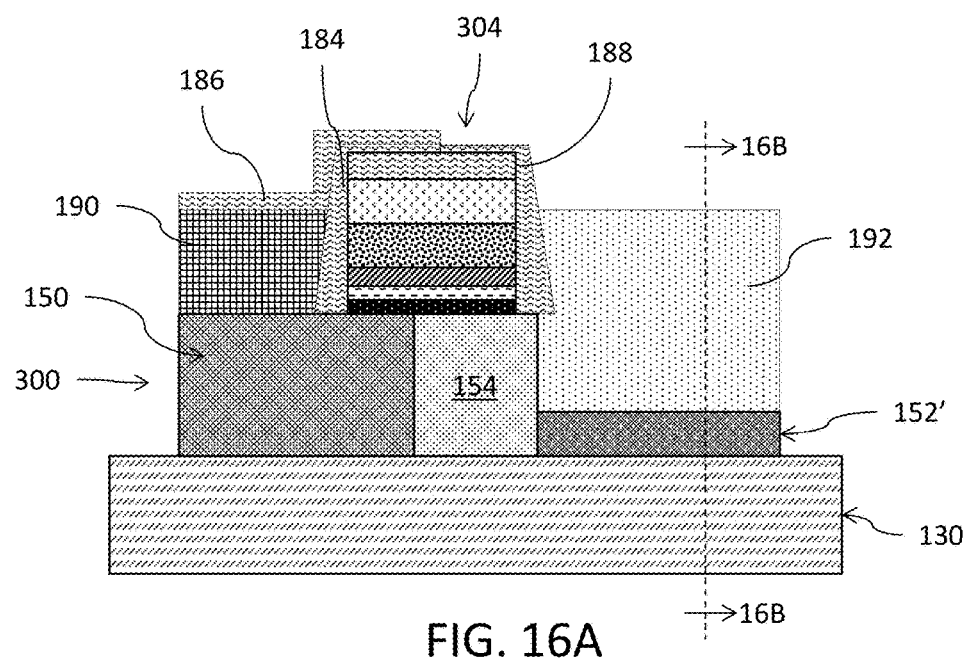
Figure 16B:
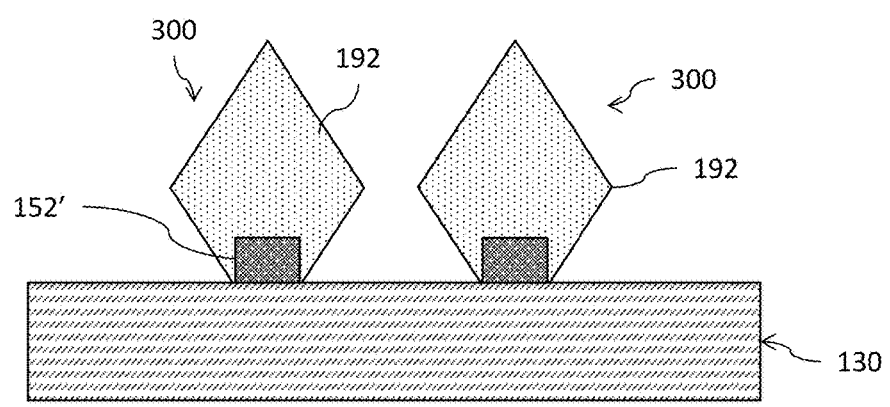

The drain region 152 of the fin 300 is then recessed using a dry etch process to a thickness of about 5-10 nm to provide a recessed germanium content drain region 152'. An epitaxial growth process as known in the art is then used to grow a silicon drain region 192 from the exposed surfaces of the recessed drain region 152' of the fins 300. The silicon drain region 192 may, for example, be in situ doped with the second conductivity type (n-type) dopant (for example, a phosphorous dopant) with a dopant concentration of $1\times10^{20}$ to $5\times10^{20}$ at/cm$^3$. The result is shown in FIGS. 16A and 16B. The advantage of using epitaxial silicon for the drain region 192, which effectively changes the drain region material from germanium content (Ge or SiGe) to silicon content (Si), is to lower the gate induced drain leakage (GIDL) from band-to-band tunneling of the TFET structure. Additionally, the region 192 can provide a higher active dopant concentration which is beneficial to reducing contact resistance.

Figure 17:
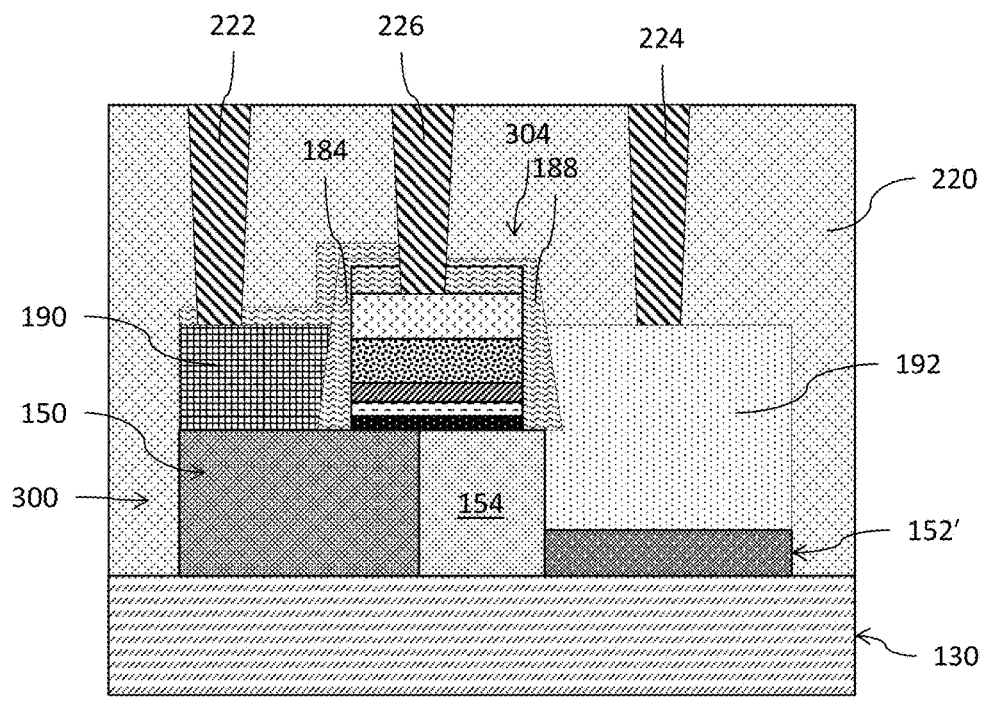

Conventional middle of the line (MOL) and back end of line (BEOL) processes are then performed to deposit and planarize a premetallization dielectric (PMD) layer 220 and form metal contacts 222, 224 and 226 to the source, drain and gate, respectively, of the TFET structure. The result is shown in FIG. 17. Silicided regions may be provided at the bottom of each metal contact 222, 224 and 226. One or more metallization layers (not explicitly shown) may be provided above the PMD layer 220 to assist with making circuit interconnections to the contacts 222, 224 and 226.

The resulting TFET structure accordingly includes a p-type doped high germanium content (Ge or SiGe) source region 150/190, an n-type doped high germanium content (Ge or SiGe) channel region 154 and an n-type doped silicon drain region 192. The gate electrode for the TFET is formed by the work function metal (layer 164), ferroelectric material region (layer 166) and polysilicon region (layer 168), and this gate electrode is insulated from the channel region 154 by the high-k dielectric region (layer 160). The band-to-band tunneling (BTBT) occurs, in response to application of an appropriate voltage to the gate electrode, in the portion of the source region 150 underneath the gate stack 304.

Reference is now made to FIGS. 18-30 which illustrate the process steps in the formation of a tunneling field effect transistor (TFET) device. It will be understood that the drawings do not necessarily show features drawn to scale.

Figure 18:
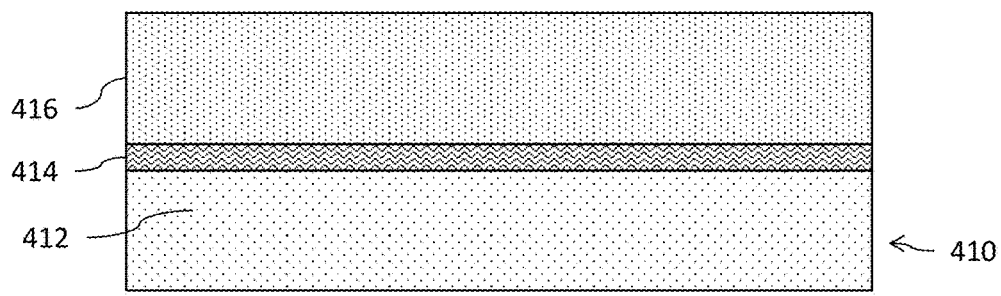
FIGS. 18-30 illustrate process steps in the formation of a TFET device.

FIG. 18 shows a silicon on insulator (SOI) semiconductor substrate 410 comprising a semiconductor substrate 412, an insulating layer 414 and a tensile strained silicon semiconductor layer 416 in a stack. The semiconductor layer 416 may be doped in accordance with the application, or alternatively may be un-doped in which case the SOI substrate 110 is of the "fully-depleted" type. The semiconductor layer 416 may, for example, have a thickness of 35-50 nm. The insulating layer 414 is commonly referred to in the art as a buried oxide (BOX) layer.

Figure 19:
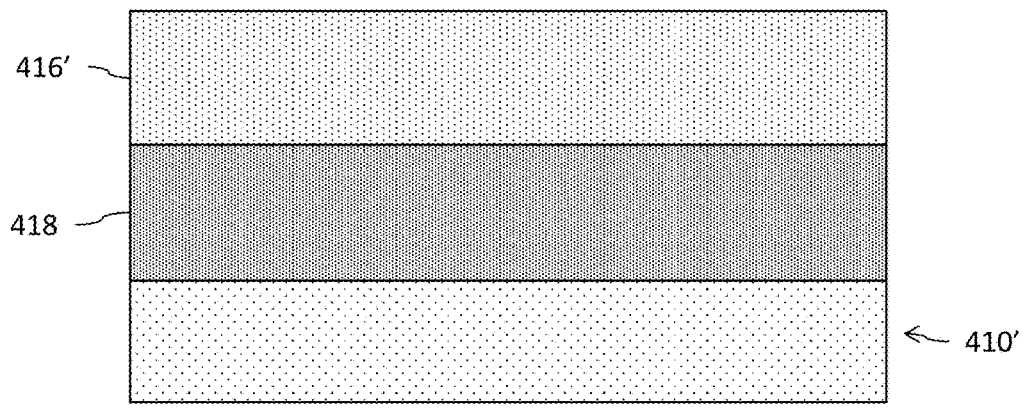

As an alternative, a bulk silicon semiconductor wafer 410' could be used as the starting point for the process. An epitaxial growth process as known in the art is then used to grow a thick semiconductor layer 418 made of silicon-germanium (SiGe) on top of the bulk wafer 410'. The layer 120' may, for example have a thickness of >500 nm. This SiGe layer 418 is at first compressively stressed, but as the layer grows the stress relaxes until the material is fully relaxed SiGe. An epitaxial growth process as known in the art is then used to grow a semiconductor layer 416' made of silicon (Si) on top of the SiGe layer 418. The semiconductor layer 416' may be doped in accordance with the application. Because the lattice of the silicon layer 416' must match the lattice of the SiGe layer 418, the silicon layer 416' is tensile strained. The result is shown in FIG. 19, with the layer 416" having a thickness of, for example, 35-50 nm.

Figure 20:
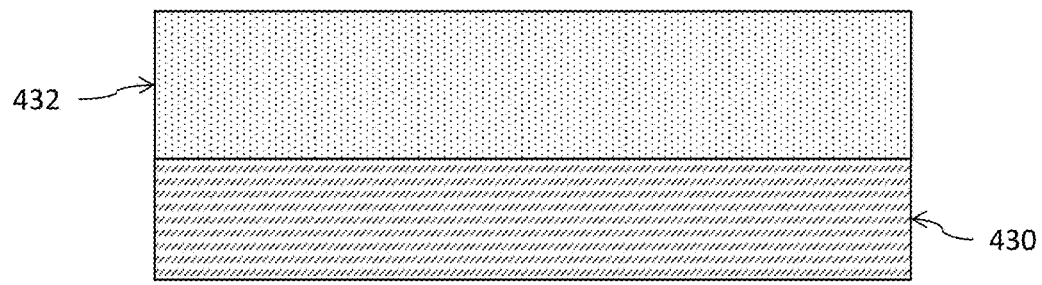

Reference is now made to FIG. 20. In this figure, the reference 430 generically refers to a support substrate which may, for example, comprise the semiconductor substrate 412 and insulating layer 414 from the tensile strained SOI substrate 410 (see, FIG. 18). Alternatively, the support substrate of reference 430 comprises the SiGe layer 418 and bulk silicon semiconductor wafer 410' (see, FIG. 19). Furthermore, the reference 432 generically refers to one of the tensile strained silicon semiconductor layers 416 or 416'. So, it will be understood that the remaining process steps described below in the fabrication of the TFET device may use either substrate as a starting point.

Figure 21:
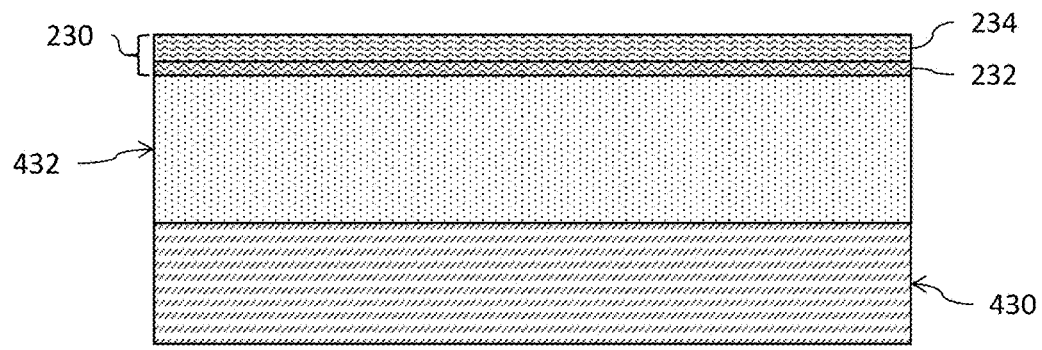

A hard mask 230 comprising a layer of silicon dioxide (SiO$_2$) 232 and a layer of silicon nitride (SiN) 234 is then deposited on the tensile stressed semiconductor layer 432. The silicon dioxide layer 232 may, for example, be deposited using a chemical vapor deposition (CVD) process with a thickness of, for example, approximately 3-10 nm. The silicon nitride layer 234 may, for example, be deposited using a chemical vapor deposition (CVD) process with a thickness of, for example, approximately 20-40 nm. The result is shown in FIG. 21.

Figure 22A:
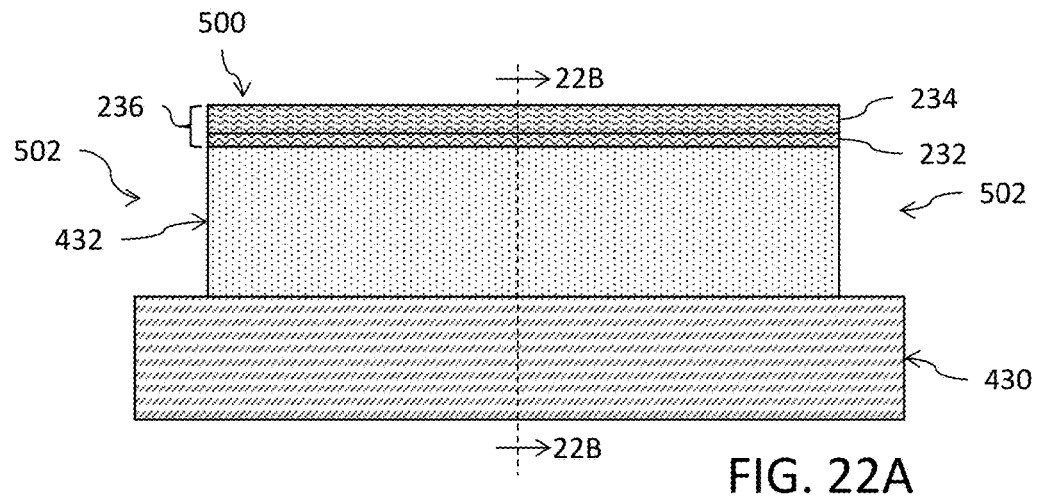
Figure 22B:
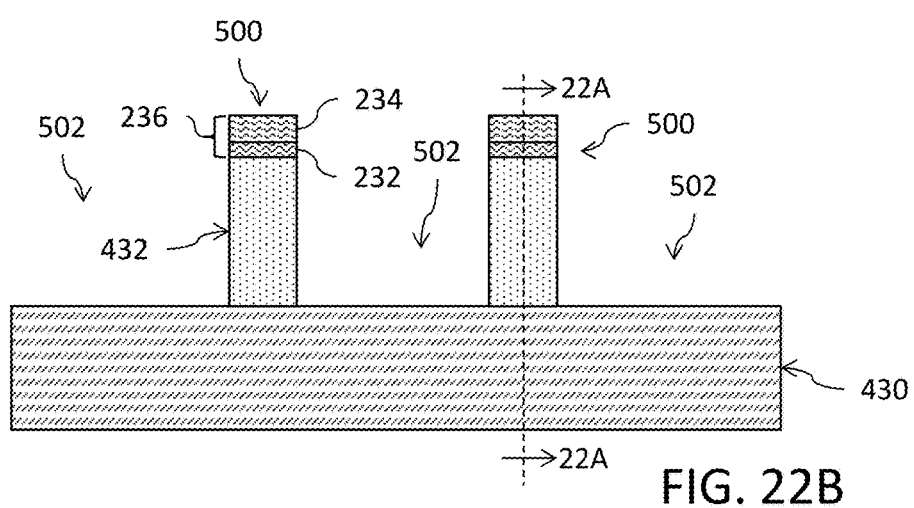

A lithographic process as known in the art is then used to define a plurality of fins 500 from the tensile stressed semiconductor layer 432. The hard mask 230 is patterned to leave mask material 236 at the desired locations of the fins 500. An etching operation is then performed through the mask to open apertures 502 on each side of each fin 500. In a preferred embodiment with the SOI substrate, for example, the etch which defines the fins 500 extends to a depth which reaches the insulating layer 414. The fins 500 may have a width of 6-12 nm and a pitch of 24-50 nm (with a spacing between adjacent fins of 10-40 nm). The result of the etching process for fin formation is shown in FIGS. 22A and 22B. The mask material 236 is then removed.

The process next moves to the deposition of the dummy gate stack materials as known to those skilled in the art for use in connection with a replacement metal gate (RMG) fabrication. The dummy gate stack materials comprise a polysilicon layer 510 and a hard mask layer 512. The polysilicon layer 510 is, for example, deposited using a chemical vapor deposition technique to a thickness of 20-60 nm and may be doped as necessary for the application. The hard mask layer 512 may, for example, comprise silicon nitride (SiN) deposited using a chemical vapor deposition technique to a thickness of 20-40 nm.

Figure 23A:
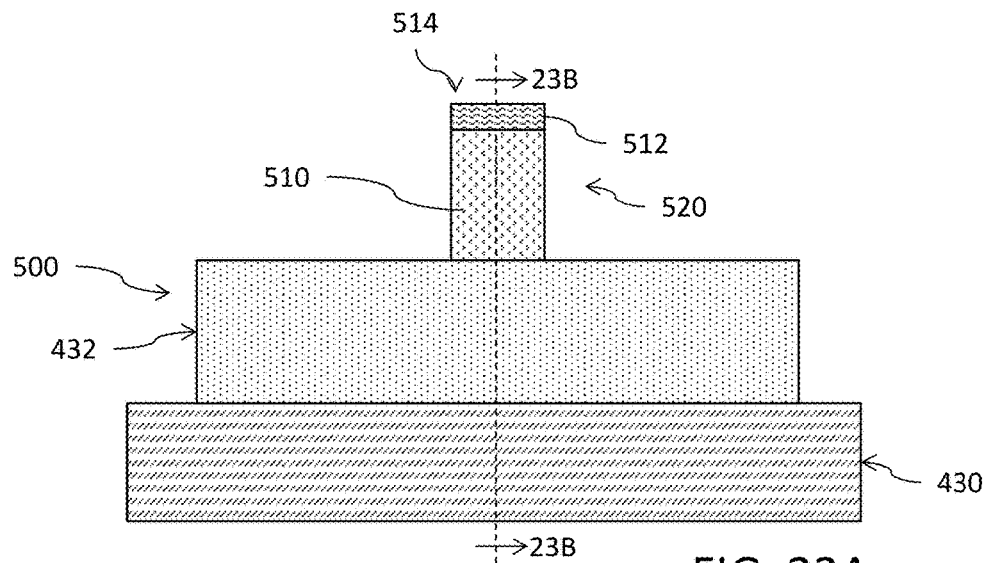
Figure 23B:
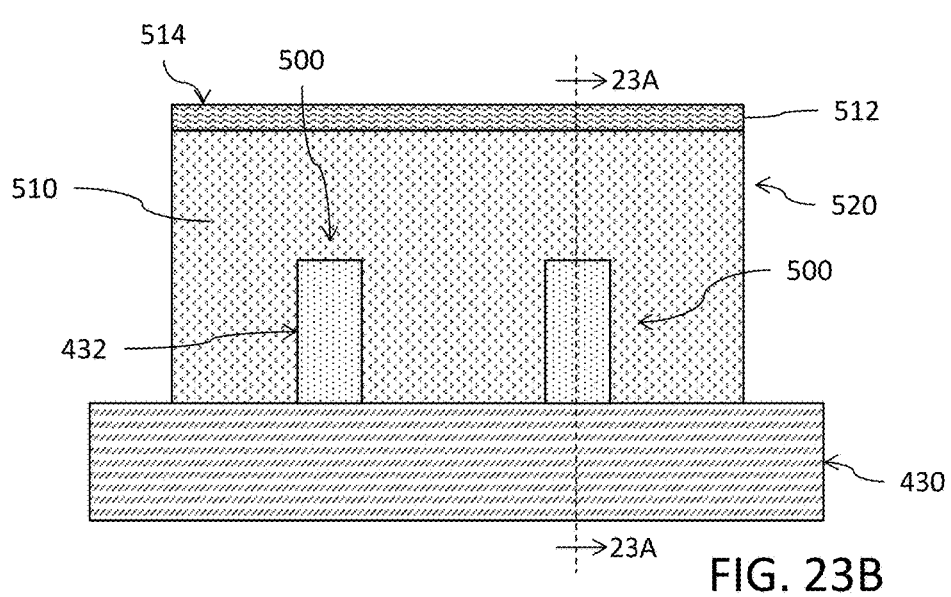

A lithographic process as known in the art is then used to define the dummy gate stack 520 from the dummy gate stack materials. The hard mask 512 is patterned to leave mask material 514 at the desired location of the gate stack 304. An etching operation is then performed through the mask to form the dummy gate stack 520 from the layers 510-512. The dummy gate stack 520 may have a width of 20-50 nm. The result of the etching process for dummy gate stack formation is shown in FIG. 23A-23B. It will be understood that the gate stack 520 extends perpendicular to and straddles over the fins 500 with a configuration as is known in the art with respect to finFET transistors and generally shown in FIG. 23B.

Figure 24:
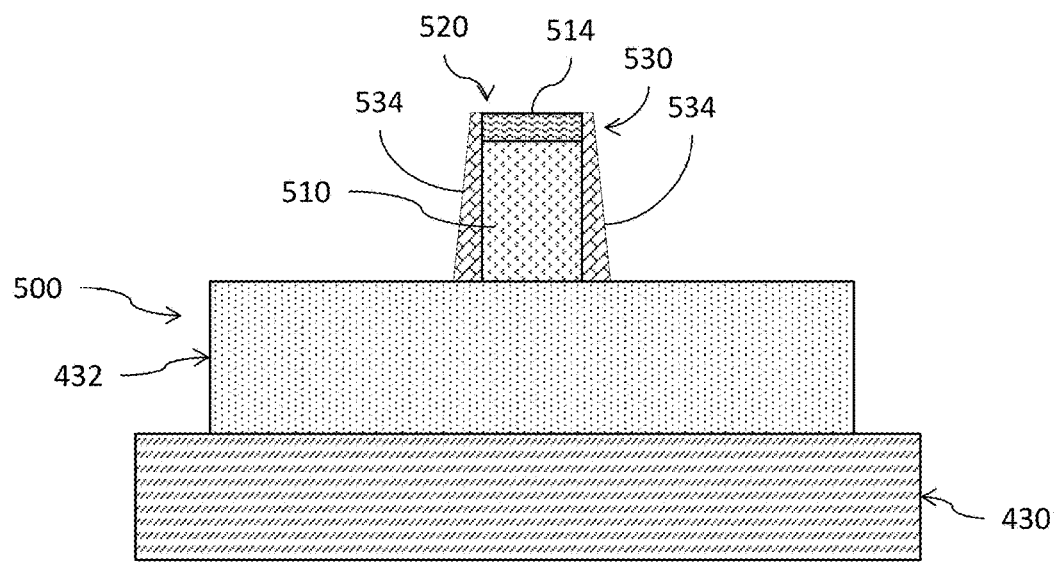

A conformal deposit of a layer 530 of low-k dielectric material (for example, SiBCN) is then made using an atomic layer deposition technique. The layer 530 may have a thickness of 6-12 nm. A directional etch, such as a reactive ion etch (RIE), is then performed to define sidewall spacers 534 on each side of the dummy gate stack 520. The result is shown in FIG. 24.

Figure 25A:
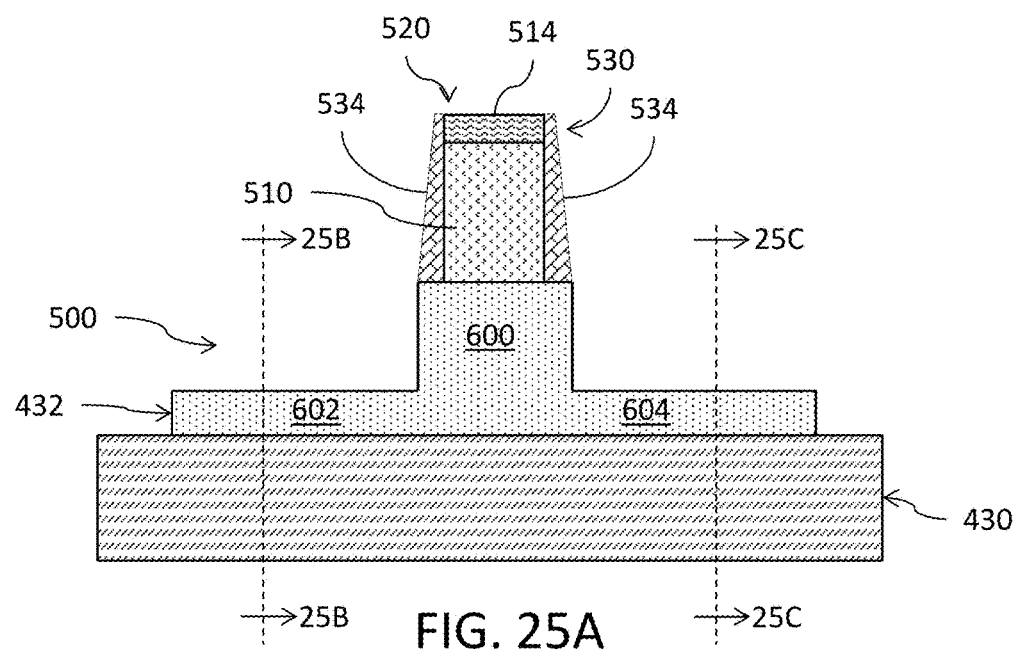
Figure 25B:
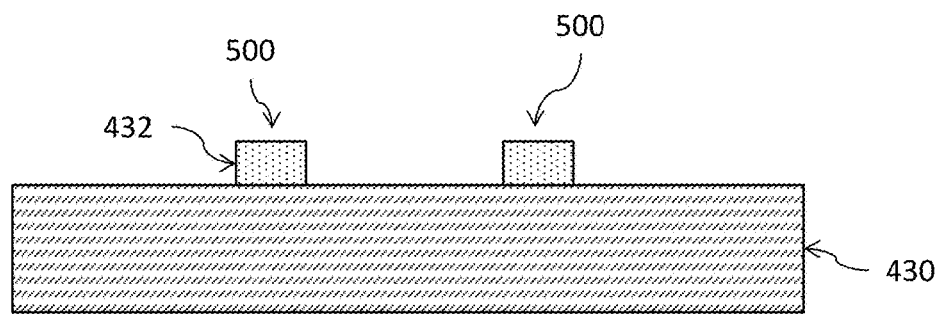
Figure 25C:
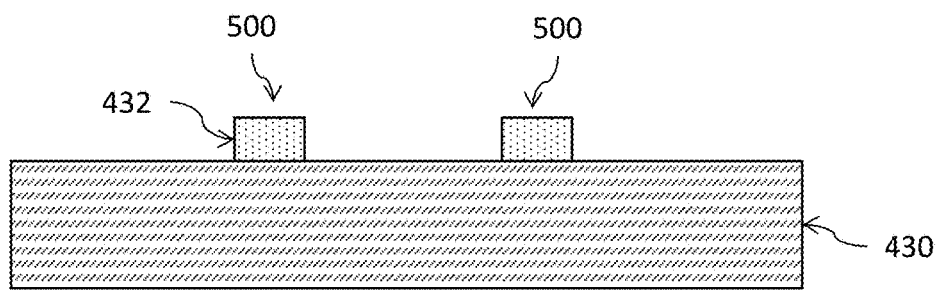

The tensile stressed silicon semiconductor material of the fin 500 is then recessed using a dry etch process to a thickness of about 5-10 nm on each side of the dummy gate stack 520 using the dummy gate stack and sidewall spacers 534 as a mask. The result of this recess process is shown in FIGS. 25A-25C. A tensile stressed semiconductor material channel region 600 remains underneath the dummy gate stack and sidewall spacers 534. This region 600 may, for example, be doped with an n-type dopant in connection with the formation of layer 432. A reduced thickness tensile stressed semiconductor material source region 602 remains on one side of the channel region 600 and a reduced thickness tensile stressed semiconductor material drain region 604 remains on the other side of the channel region 600.

Figure 26:
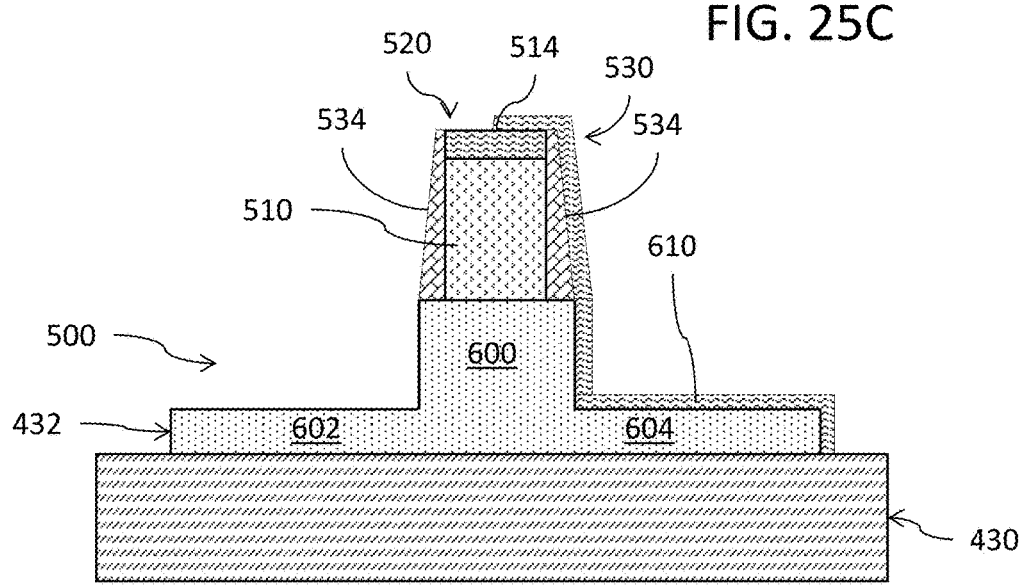

A conformal deposit of a layer 610 of silicon nitride (SiN) is then made using an atomic layer deposition technique. The layer 610 may have a thickness of 3-5 nm. A lithographic process as known in the art is then used to remove the layer on one side of the dummy gate stack and sidewall spacers 534 (for example, on the source side). The result is shown in FIG. 26.

Figure 27A:
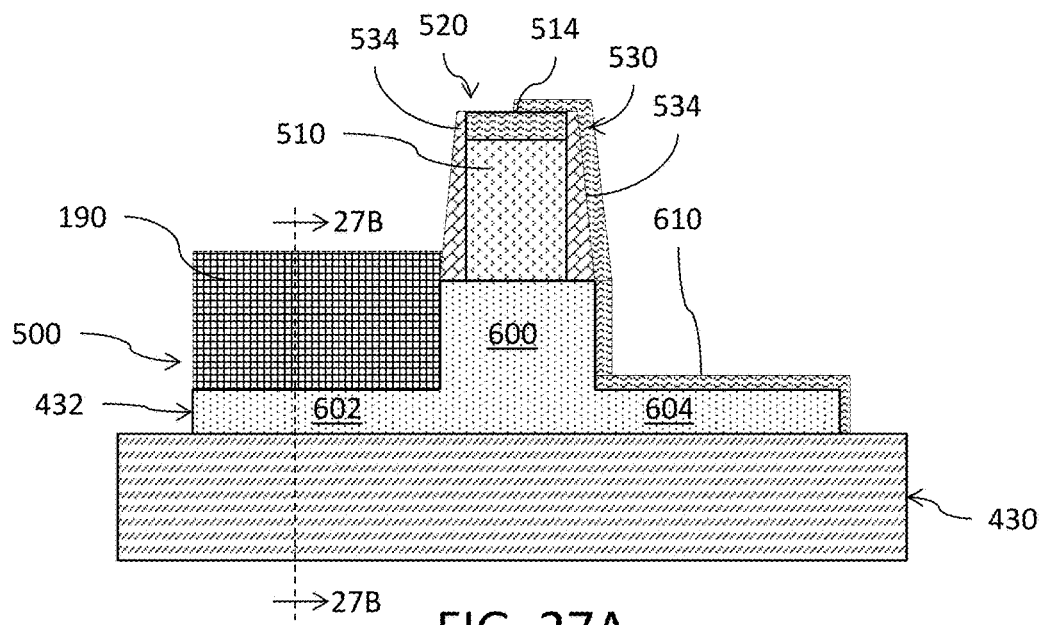
Figure 27B:
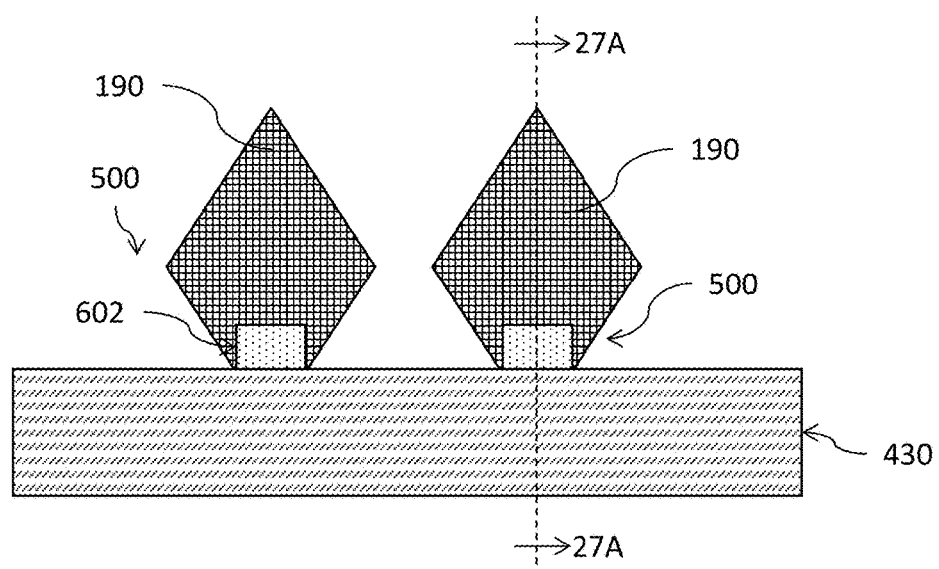

An epitaxial growth process as known in the art is then used to grow a silicon-germanium source region 190 from the exposed surfaces of the reduced thickness tensile stressed semiconductor material region 602 of the fins 500. The silicon-germanium source region 190 may, for example, be in situ doped with the first conductivity type (p-type) using a boron dopant with a dopant concentration of $1\times10^{20}$ to $5\times10^{20}$ at/cm$^3$. The result is shown in FIGS. 27A and 27B. The presence of source region 190 over source region 602 can provide a higher active dopant concentration which is beneficial to reducing contact resistance.

Figure 28:
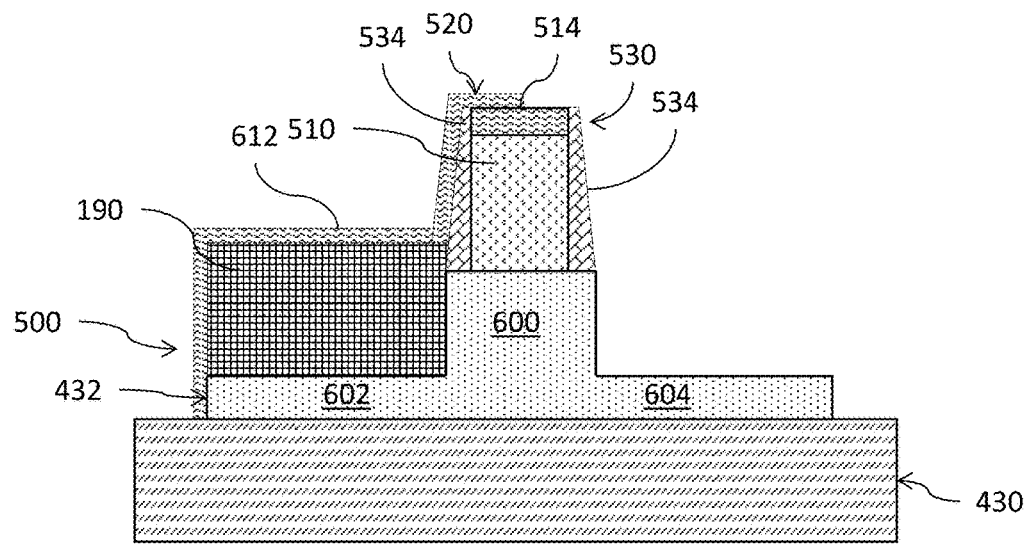

A conformal deposit of a layer 612 of silicon nitride (SiN) is then made using an atomic layer deposition technique to protect the silicon-germanium source region 190 and tensile stressed source region 602. The layer 612 may have a thickness of 3-5 nm. A lithographic process as known in the art is then used to remove the layer on the other side of the dummy gate stack and sidewall spacers 534. The result is shown in FIG. 28.

Figure 29A:
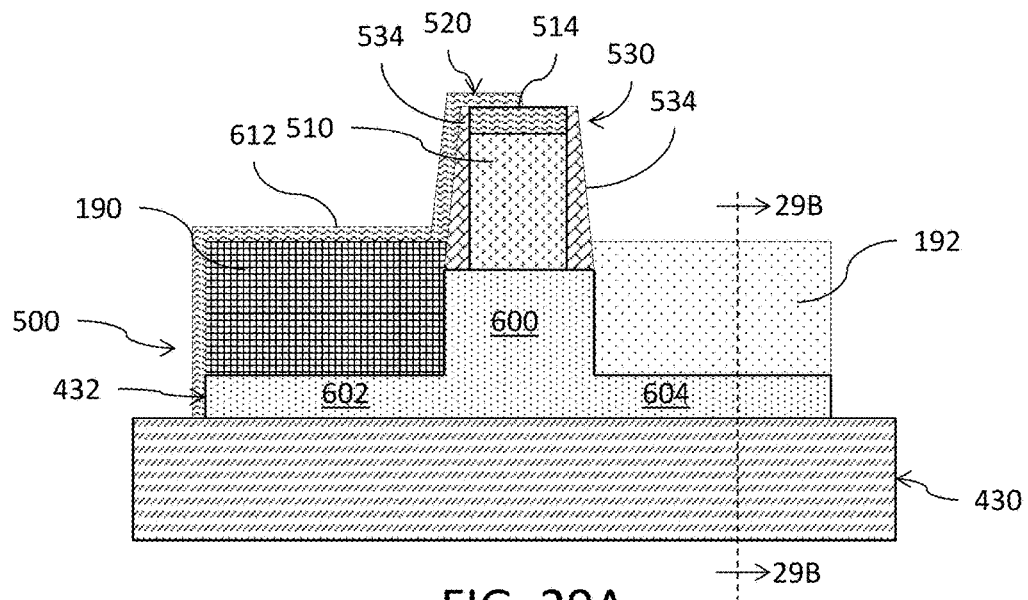
Figure 29B:
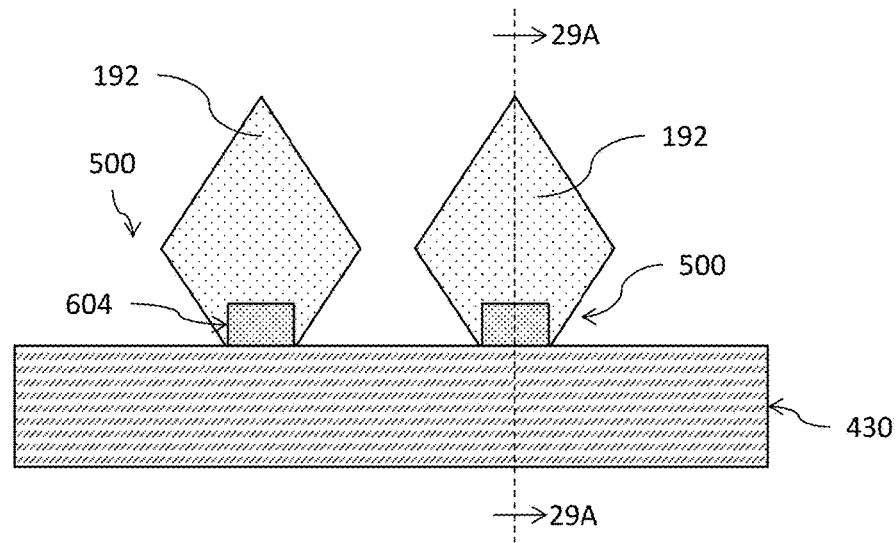

An epitaxial growth process as known in the art is then used to grow a silicon drain region 192 from the exposed surfaces of the reduced thickness tensile stressed semiconductor material drain region 604 of the fins 500. The silicon drain region 192 may, for example, be in situ doped with the second conductivity type (n-type) using a phosphorous dopant with a dopant concentration of $1\times10^{20}$ to $5\times10^{20}$ at/cm$^3$. The result is shown in FIGS. 29A and 29B. The advantage of using epitaxial silicon for the drain region 192 is to lower the gate induced drain leakage (GIDL) from band-to-band tunneling of the TFET device. The presence of drain region 192 over drain region 604 can provide a higher active dopant concentration which is beneficial to reducing contact resistance.

Figure 30:
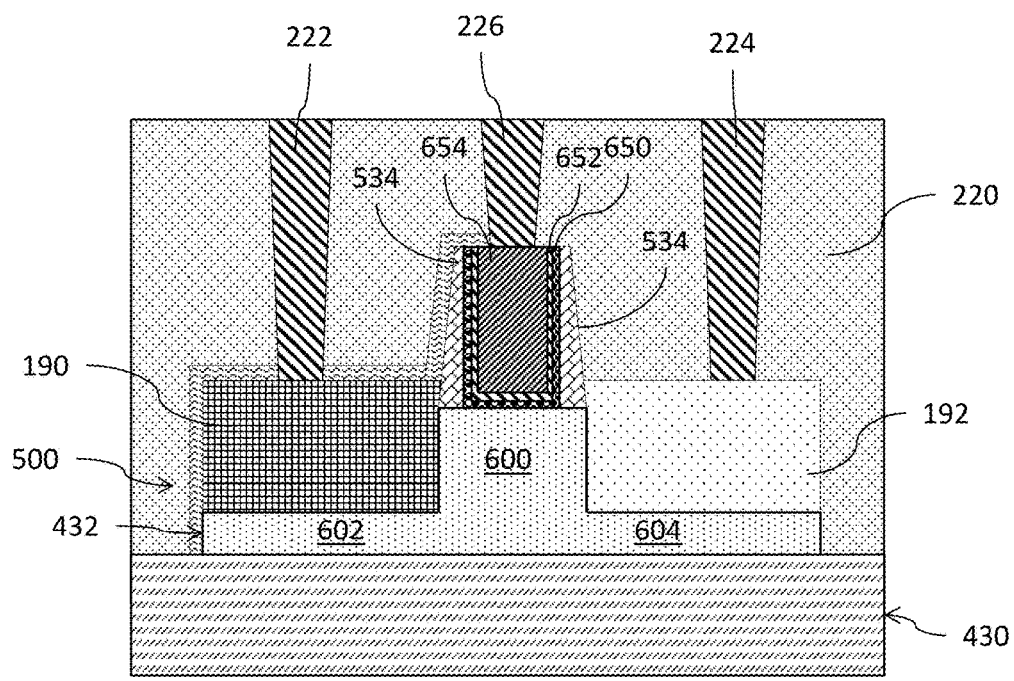

Using well known processing techniques, the dummy gate is then replaced with a replacement metal gate (RMG) comprising a high-k dielectric layer 650, a work function metal layer 652 and a metal (for example, tungsten) fill 654. It will further be understood that the fill 654 may comprise a region of ferroelectric material (see, reference 166 described above) along with an overlying tungsten (or other contact metal) deposit. Conventional middle of the line (MOL) and back end of line (BEOL) processes are then performed to deposit and planarize a premetallization dielectric (PMD) layer 220 and form metal contacts 222, 224 and 226 to the source, drain and gate, respectively, of the TFET structure. The result is shown in FIG. 30. Silicided regions may be provided at the bottom of each metal contact 222, 224 and 226. One or more metallization layers (not explicitly shown) may be provided above the PMD layer 220 to assist with making circuit interconnections to the contacts 222, 224 and 226.

The resulting TFET structure accordingly includes a p-type doped germanium content (SiGe) source region (provided by silicon-germanium source region 190 on fin strained silicon region 602), a strained silicon (n-type) channel region 600 and an n-type doped silicon drain region (provided by silicon drain region 192 on fin strained silicon region 604). The gate electrode for the TFET is formed by the work function metal (layer 652) and metal fill 654 (perhaps also including ferroelectric material for use in inducing a negative capacitive effect for the gate electrode), and is insulated from the channel region 154 by the high-k dielectric region (layer 650). The band-to-band tunneling (BTBT) occurs, in response to an appropriate voltage to the gate electrode, in the portion of the source region underneath the replacement metal gate.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:
1. A tunneling field effect transistor, comprising:
a support substrate;
a fin of semiconductor material including a source region, a drain region and a channel region between the source region and drain region, wherein the source and channel regions have a first fin thickness and wherein the drain region has a second fin thickness less than the first fin thickness;
a gate electrode straddling over the fin at said channel region;
sidewall spacers on each side of the gate electrode;
an epitaxial material germanium content source region in contact with and having a same crystal orientation as the source region of said fin and doped with a first conductivity type; and an epitaxial material silicon content drain region in contact with and having a same crystal orientation as the drain region of said fin and doped with a second conductivity type.

2. The tunneling field effect transistor of claim 1, wherein said source region is doped with the first conductivity type and the drain region is doped with the second conductivity type.

3. The tunneling field effect transistor of claim 2, wherein said fin of semiconductor material has a germanium content in excess of 80%.

4. The tunneling field effect transistor of claim 2, wherein said channel region is doped with the second conductivity type.

5. The tunneling field effect transistor of claim 1, wherein said fin of semiconductor material is made of germanium.

6. The tunneling field effect transistor of claim 1, wherein said fin of semiconductor material is made of silicon-germanium.

7. The tunneling field effect transistor of claim 1, wherein said fin of semiconductor material is made of tensile strained silicon.

8. The tunneling field effect transistor of claim 1, wherein the gate electrode comprises: a work function metal and a ferroelectric material.

9. The tunneling field effect transistor of claim 1, wherein said support substrate comprises a silicon on insulator substrate.

10. The tunneling field effect transistor of claim 1, wherein said support substrate comprises a bulk substrate.

11. The tunneling field effect transistor of claim 1, wherein a conductive portion of the gate electrode straddles over the fin of semiconductor material at the channel region and at a portion of the source region of said fin of semiconductor material but does not straddle over the fin of semiconductor material at the drain region.

12. A tunneling field effect transistor, comprising:
a support substrate;
a fin of semiconductor material including a source region, a drain region and a channel region between the source region and drain region, wherein at least one of the source region and drain region is recessed to have a first fin thickness that is less than a second thickness of the channel region;
a gate electrode straddling over the fin at said channel region;
sidewall spacers on each side of the gate electrode;
an epitaxial material germanium content source region in contact with and having a same crystal orientation as the source region of said fin and doped with a first conductivity type; and
an epitaxial material silicon content drain region in contact with and having a same crystal orientation as the drain region of said fin and doped with a second conductivity type.

13. The tunneling field effect transistor of claim 12, wherein said fin of semiconductor material is made of germanium.

14. The tunneling field effect transistor of claim 12, wherein said fin of semiconductor material is made of silicon-germanium.

15. The tunneling field effect transistor of claim 12, wherein said fin of semiconductor material is made of tensile strained silicon.

16. The tunneling field effect transistor of claim 12, wherein the drain region is recessed and wherein a conductive portion of the gate electrode straddles over the fin of semiconductor material at the channel region and at a not recessed portion of the source region of said fin of semiconductor material but does not straddle over the fin of semiconductor material at the recessed drain region.

17. A tunneling field effect transistor, comprising:
a support substrate;
a fin of semiconductor material including a source region, a drain region and a channel region between the source region and drain region;
a gate electrode straddling over the fin at said channel region;
sidewall spacers on each side of the gate electrode;
an epitaxial germanium content source region in contact with the source region of said fin and doped with a first conductivity type; and
an epitaxial silicon content drain region in contact with the drain region of said fin and doped with a second conductivity type;
wherein a conductive portion of the gate electrode straddles over the fin of semiconductor material at the channel region and at a portion of the source region of said fin of semiconductor material but does not straddle over the fin of semiconductor material at the drain region.

18. The tunneling field effect transistor of claim 17, wherein said source region is doped with the first conductivity type and the drain region is doped with the second conductivity type.

19. The tunneling field effect transistor of claim 18, wherein the source and channel regions of the fin of semiconductor material have a first thickness and wherein the drain region of the fin of semiconductor material has a second thickness less than the first thickness.

20. The tunneling field effect transistor of claim 18, wherein said fin of semiconductor material has a germanium content in excess of 80%.

21. The tunneling field effect transistor of claim 20, wherein said fin of semiconductor material is made of germanium.

22. The tunneling field effect transistor of claim 20, wherein said fin of semiconductor material is made of silicon-germanium.

23. The tunneling field effect transistor of claim 18, wherein said channel region is doped with the second conductivity type.

24. The tunneling field effect transistor of claim 17, wherein the channel region of the fin of semiconductor material has a first thickness and wherein the source and drain regions of the fin of semiconductor material have second thicknesses less than the first thickness.

25. The tunneling field effect transistor of claim 17, wherein said fin of semiconductor material is made of tensile strained silicon.

26. The tunneling field effect transistor of claim 17, wherein the gate electrode comprises: a work function metal and a ferroelectric material.

27. The tunneling field effect transistor of claim 17, wherein the gate electrode comprises: a work function metal and a metal fill.

28. The tunneling field effect transistor of claim 17, wherein said support substrate comprises a silicon on insulator substrate.

29. The tunneling field effect transistor of claim 17, wherein said support substrate comprises a bulk substrate.

* * * * *